(12) United States Patent
Mizuochi et al.

(10) Patent No.: US 11,440,985 B2
(45) Date of Patent: Sep. 13, 2022

(54) UNDERLAYER FILM-FORMING COMPOSITION FOR USE IN FORMING A MICROPHASE-SEPARATED PATTERN

(71) Applicant: NISSAN CHEMICAL CORPORATION, Tokyo (JP)

(72) Inventors: Ryuta Mizuochi, Toyama (JP); Yasunobu Someya, Toyama (JP); Hiroyuki Wakayama, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 244 days.

(21) Appl. No.: 16/477,910

(22) PCT Filed: Jan. 16, 2018

(86) PCT No.: PCT/JP2018/000903
§ 371 (c)(1),
(2) Date: Jul. 15, 2019

(87) PCT Pub. No.: WO2018/135455
PCT Pub. Date: Jul. 26, 2018

(65) Prior Publication Data
US 2019/0359749 A1 Nov. 28, 2019

(30) Foreign Application Priority Data

Jan. 19, 2017 (JP) .............................. JP2017-007147

(51) Int. Cl.
*C08F 212/12* (2006.01)
*C09D 125/08* (2006.01)
(Continued)

(52) U.S. Cl.
CPC ...... *C08F 212/12* (2013.01); *C08F 220/1807* (2020.02); *C08F 222/402* (2020.02);
(Continued)

(58) Field of Classification Search
CPC .................. C08F 212/12; C08F 220/18; C08F 220/1802; C08F 220/1803;
(Continued)

(56) References Cited

U.S. PATENT DOCUMENTS 8,999,631 B2 4/2015 Senzaki et al.
9,120,117 B2 9/2015 Ellison et al.
(Continued)

FOREIGN PATENT DOCUMENTS

CN 104254557 A 12/2014
GB 1439098 A * 6/1976 ................ C08F 8/00
(Continued)

OTHER PUBLICATIONS

Feb. 27, 2018 International Search Report issued in International Patent Application No. PCT/JP2018/000903.
(Continued)

*Primary Examiner* — Ling Siu Choi
*Assistant Examiner* — David L Miller
(74) *Attorney, Agent, or Firm* — Oliff PLC

(57) ABSTRACT

An underlayer film-forming composition which exhibits excellent solvent resistance, and which is capable of orthogonally inducing, with respect to a substrate, a microphase separation structure in a layer formed on the substrate, said layer including a block copolymer. The underlayer film-forming composition includes a copolymer which includes: (A) unit structures derived from styrene compounds including tert-butyl groups; (B) unit structures, other than those in (A) above, which are derived from aromatic-containing vinyl compounds which do not include hydroxy groups; (C) unit structures derived from compounds which include (meth)acryloyl groups, and do not include hydroxy groups; and (D) unit structures derived from compounds including crosslink-forming groups. The copolymerization
(Continued)

ratios with respect to the whole copolymer are: (A) 25-90 mol %; (B) 0-65 mol %; (C) 0-65 mol %; and (D) 10-20 mol %. Unit structures including aromatics account for 81-90 mol % of (A)+(B)+(C).

16 Claims, 1 Drawing Sheet

(51) Int. Cl.
| | |
|---|---|
| *C09D 133/10* | (2006.01) |
| *C08F 220/18* | (2006.01) |
| *C08F 222/40* | (2006.01) |
| *C08L 25/16* | (2006.01) |
| *C08L 33/10* | (2006.01) |
| *C09D 125/16* | (2006.01) |

(52) U.S. Cl.
CPC ......... *C09D 125/08* (2013.01); *C09D 133/10* (2013.01); *C08F 220/18* (2013.01); *C08L 25/16* (2013.01); *C08L 33/10* (2013.01); *C09D 125/16* (2013.01)

(58) Field of Classification Search
CPC .......... C08F 220/1804; C08F 220/1805; C08F 220/1806; C08F 220/1807; C08F 220/1808; C08F 220/1809; C08F 220/1811; C08F 220/1812; C08F 220/1818; C08F 220/54; C08F 220/56; C08F 220/58
See application file for complete search history.

(56) References Cited

U.S. PATENT DOCUMENTS

| | | |
|---|---|---|
| 9,834,700 B2 | 12/2017 | Ellison et al. |
| 2013/0266780 A1 | 10/2013 | Ellison et al. |
| 2013/0344242 A1 | 12/2013 | Willson et al. |
| 2015/0315402 A1* | 11/2015 | Someya ............... C09D 125/08 428/195.1 |
| 2015/0353763 A1 | 12/2015 | Ellison et al. |
| 2016/0372663 A1 | 12/2016 | Takizawa et al. |

FOREIGN PATENT DOCUMENTS

| | | | | |
|---|---|---|---|---|
| GB | 1440282 A | * | 6/1976 | ............ C08F 285/00 |
| JP | 2005048088 A | * | 2/2005 | |
| JP | 2012-62365 A | | 3/2012 | |
| JP | 2013-212489 A | | 10/2013 | |
| JP | 2014-185311 A | | 10/2014 | |
| JP | 2015-005750 A | | 1/2015 | |
| JP | 2015-167163 A | | 9/2015 | |
| NO | 2012/036121 A1 | | 3/2012 | |
| NO | 2014/097993 A1 | | 6/2014 | |
| WO | 2014/098025 A1 | | 6/2014 | |

OTHER PUBLICATIONS

Jan. 6, 2021 Office Action issued in Chinese Patent Application No. 201880007435.5.

* cited by examiner

UNDERLAYER FILM-FORMING COMPOSITION FOR USE IN FORMING A MICROPHASE-SEPARATED PATTERN

TECHNICAL FIELD

The present invention relates to an underlayer film-forming composition for use in forming a microphase-separated pattern which is formed between a substrate and a self-organized film formed on the substrate using a block copolymer, a method for producing a phase-separated pattern of the block copolymer using the underlayer film-forming composition, and a method for producing a semiconductor device.

BACKGROUND ART

In recent years, as large scale integrated circuits (LSIs) are being further scaled down, techniques for fabrication of ultrafine microstructures have been demanded. For meeting such demands, an attempt has been made to form micropatterns utilizing a phase-separated structure formed by self-organization of a block copolymer, in which polymers incompatible with each other are bound. For example, a method for forming a pattern has been proposed in which an underlayer film-forming composition is applied onto a substrate to form an underlayer film containing the composition, and a self-organized film containing a block copolymer, in which two or more polymers are bonded to each other, is formed on the surface of the underlayer film, the block copolymer in the self-organized film is caused to suffer phase separation, and a phase of at least one polymer of the polymers constituting the block copolymer is selectively removed to form a pattern.

Patent Literature 1 discloses a primer containing a resin component, in which 20 to 80% by mole of the structural units of the whole component is a structural unit derived from an aromatic ring-containing monomer.

Patent Literature 2 discloses an underlayer film-forming composition for a self-organized film containing a polymer having a unit structure of an aromatic vinyl compound optionally substituted, such as styrene, vinylnaphthalene, acenaphthylene, or vinylcarbazole, in an amount of 20% by mole or more, based on the mole of the whole unit structure of the polymer, and having a unit structure of a polycyclic aromatic vinyl compound in an amount of 1% by mole or more, based on the mole of the whole unit structure of the aromatic vinyl compound.

However, a technique has still been desired for forming an underlayer film which has excellent solvent resistance, and which allows a microphase-separated structure of the layer containing a block copolymer to become perpendicular to the substrate.

CITATION LIST

Patent Literature

Patent Literature 1: WO 2012/036121 A1
Patent Literature 2: WO 2014/097993 A1

SUMMARY OF INVENTION

Technical Problem

Accordingly, an object of the present invention is to provide a composition for forming an underlayer film formed between a substrate and a self-organized film containing a block polymer, which has excellent solvent resistance, and allows a microphase-separated structure of the layer containing a block copolymer to become perpendicular to the substrate. Another object is to provide a method for producing a phase-separated pattern of the block copolymer using the underlayer film-forming composition and a method for producing a semiconductor device.

Solution to Problem

The present invention embraces the following.

[1] An underlayer film-forming composition for use in causing a layer comprising a block copolymer formed on a substrate to suffer phase separation, wherein the composition comprises a copolymer having:

(A) a unit structure derived from a styrene compound containing a tert-butyl group, (B) a unit structure derived from an aromatic group-containing vinyl compound containing no hydroxy group, which differs from unit structure (A), (C) a unit structure derived from a compound containing (a)an (meth)acryloyl group and containing no hydroxy group, and (D) a unit structure derived from a crosslink-forming group-containing compound, wherein the copolymer has a copolymerization ratio of: (A) 25 to 90% by mole, (B) 0 to 65% by mole, (C) 0 to 65% by mole, and (D) 10 to 20% by mole, and wherein the copolymer has a proportion of an amount of unit structures containing an aromatic group based on a total amount of unit structures (A), (B), and (C) of 81 to 90% by mole.

[2] The composition according to [1], wherein the copolymer is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure derived from a lactide are bound.

[3] The composition according to [1], wherein unit structure (A) derived from a styrene compound containing a tert-butyl group is represented by formula (1):

[Chemical formula 1]

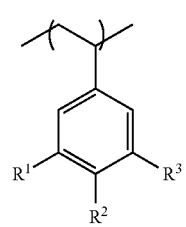

Formula (1)

wherein one or two of $R^1$ to $R^3$ are a tert-butyl group.

[4] The composition according to [1], wherein unit structure (D) derived from a crosslink-forming group-containing compound is represented by formula (2-1), (2-2), (3-1), or (3-2):

[Chemical formula 2]

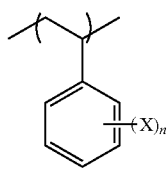

Formula (2-1)

[Chemical formula 3]

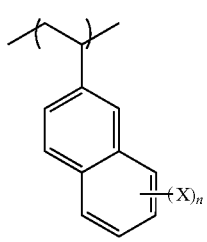

Formula (2-2)

wherein, in formulae (2-1) and (2-2), each of n quantity of X independently represents a hydroxy group, a halogen atom, an alkyl group, an alkoxy group, a cyano group, an amide group, an alkoxycarbonyl group, or a thioalkyl group, and n represents an integer of 1 to 7,

[Chemical formula 4]

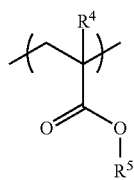

Formula (3-1)

[Chemical formula 5]

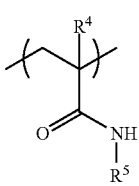

Formula (3-2)

wherein, in formulae (3-1) and (3-2), $R^4$ represents a hydrogen atom or a methyl group, and $R^5$ represents a hydroxyphenyl group or a linear, branched, or cyclic alkyl group having 1 to 10 carbon atoms, which contains a hydroxy group and is optionally substituted with a halogen atom.

[5] The composition according to [1], wherein unit structure (B) derived from an aromatic group-containing vinyl compound containing no hydroxy group, which differs from unit structure (A), is represented by formula (4-1) or (4-2):

[Chemical formula 6]

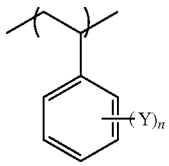

Formula (4-1)

[Chemical formula 7]

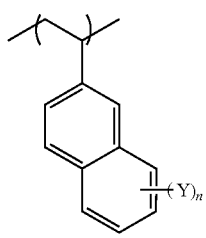

Formula (4-2)

wherein, in formulae (4-1) and (4-2), each of n quantity of Y independently represents a halogen atom, an alkyl group, an alkoxy group, a cyano group, an amide group, an alkoxycarbonyl group, or a thioalkyl group, and n represents an integer of 0 to 7.

[6] The composition according to [1], wherein unit structure (C) derived from a compound containing (a)an (meth) acryloyl group and containing no hydroxy group is represented by formula (5-1) or (5-2):

[Chemical formula 8]

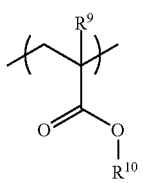

Formula (5-1)

[Chemical formula 9]

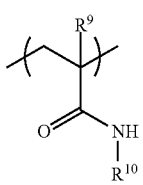

Formula (5-2)

wherein, in formulae (5-1) and (5-2), $R^9$ represents a hydrogen atom or a methyl group, and $R^{10}$ independently represents a hydrogen atom, an alkoxy group having 1 to 5 carbon atoms, a benzyl group, an anthrylmethyl group, or a linear, branched, or cyclic alkyl group having 1 to 10 carbon atoms, which is optionally substituted with a halogen atom.

[7] The composition according to [1], wherein unit structure (B) derived from an aromatic group-containing vinyl compound containing no hydroxy group, which differs from unit structure (A), is a unit structure derived from vinylnaphthalene.

[8] A method for producing a phase-separated pattern of a block copolymer, comprising the steps of:
(1) forming an underlayer film on a substrate using the composition according to any one of [1] to [7];

(2) forming a block copolymer layer on the underlayer film; and
(3) causing the block copolymer layer formed on the underlayer film to suffer phase separation.

[9] The method according to [8], further comprising the step of forming an upper layer film on the block copolymer layer between step (2) and step (3).

[10] The method according to [8] or [9], wherein the copolymer is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure derived from a lactide are bound.

[11] A method for producing a semiconductor device, comprising the steps of:
(1) forming an underlayer film on a substrate using the composition according to any one of [1] to [7];
(2) forming a block copolymer layer on the underlayer film;
(3) causing the block copolymer layer formed on the underlayer film to suffer phase separation;
(4) subjecting the phase-separated block copolymer layer to etching; and
(5) subjecting the substrate to etching.

[12] The method according to [11], wherein the copolymer is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure derived from a lactide are bound.

[13] An underlayer film for use in causing a layer comprising a block copolymer formed on a substrate to suffer phase separation, wherein the underlayer film comprises a copolymer having:
(A) a unit structure derived from a styrene compound containing a tert-butyl group,
(B) a unit structure derived from an aromatic group-containing vinyl compound containing no hydroxy group, which differs from unit structure (A),
(C) a unit structure derived from a compound containing (a)an (meth)acryloyl group and containing no hydroxy group, and
(D) a unit structure derived from a crosslink-forming group-containing compound,
wherein the copolymer has a copolymerization ratio of: (A) 25 to 90% by mole, (B) 0 to 65% by mole, (C) 0 to 65% by mole, and (D) 10 to 20% by mole, and
wherein the copolymer has a proportion of an amount of unit structures containing an aromatic group based on a total amount of unit structures (A), (B), and (C) of 81 to 90% by mole.

[14] The underlayer film according to item [13], wherein the copolymer is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure derived from a lactide are bound.

Advantageous Effects of Invention

The underlayer film formed using the underlayer film-forming composition of the present invention has excellent solvent resistance and allows a microphase-separated structure of the layer containing a block copolymer to become perpendicular to the substrate.

DESCRIPTION OF EMBODIMENTS

Figure 1:
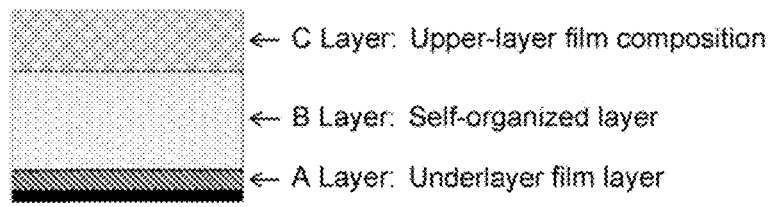
FIG. 1 A view showing the arrangement of a substrate, an underlayer film (A layer), a self-organized film (B layer), and an upper-layer film composition (C layer).

In the present invention, there are provided:
an underlayer film-forming composition for use in causing a layer comprising a block copolymer formed on a substrate to suffer phase separation,
wherein the composition comprises a copolymer having:
(A) a unit structure derived from a styrene compound containing a tert-butyl group,
(B) a unit structure derived from an aromatic group-containing vinyl compound containing no hydroxy group, which differs from unit structure (A),
(C) a unit structure derived from a compound containing (a)an (meth)acryloyl group and containing no hydroxy group, and
(D) a unit structure derived from a crosslink-forming group-containing compound,
wherein the copolymer has a copolymerization ratio of: (A) 25 to 90% by mole, (B) 0 to 65% by mole, (C) 0 to 65% by mole, and (D) 10 to 20% by mole, and
wherein the copolymer has a proportion of an amount of unit structures containing an aromatic group based on a total amount of unit structures (A), (B), and (C) of 81 to 90% by mole,
an underlayer film comprising the above-mentioned copolymer,
a method for producing a phase-separated pattern of a block copolymer using the above-mentioned underlayer film-forming composition, and
a method for producing a semiconductor device.
These are individually described below.

1. Synthesis of Copolymer

The copolymer contained in the underlayer film-forming composition of the present invention for use in causing a layer comprising a block copolymer formed on a substrate to suffer phase separation can be produced by subjecting the below-mentioned monomers to copolymerization by a method commonly used, for example, bulk polymerization, solution polymerization, suspension polymerization, or emulsion polymerization so that the copolymerization ratio becomes an appropriate molar ratio. Solution polymerization is especially preferred, and, in this case, for example, polymerization can be conducted by adding desired monomers to a solvent having added an additive and a polymerization initiator.

In the present invention, the copolymer means a copolymer which is not limited to a compound of high molecular weight, and accordingly, a monomer is excluded from the copolymer, but an oligomer is not excluded.

Further, the below-mentioned monomers may be used alone or in combination of two or more.

1.1. Monomer 1.1.1. Styrene Compound Containing a Tert-Butyl Group

The aromatic ring of styrene is substituted with one or more tert-butyl groups. The number of tert-butyl group ranges from 1 to 5.

Preferred is a compound represented by formula (1'):

[Chemical formula 10]

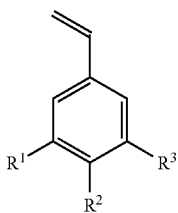

Formula (1')

wherein one or two of $R^1$ to $R^3$ are a tert-butyl group.

More preferred is 4-tert-butylstyrene.

1.1.2. Aromatic Group-Containing Vinyl Compound Containing No Hydroxy Group

The aromatic group-containing vinyl compound containing no hydroxy group in the present invention is an aromatic group-containing vinyl compound that is different from the above-mentioned styrene compound containing a tert-butyl group.

Preferred are compounds represented by formulae (4'-1) and (4'-2):

[Chemical formula 11]

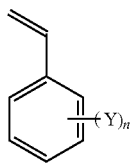

Formula (4'-1)

[Chemical formula 12]

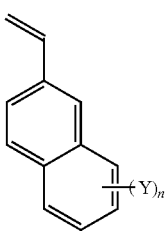

Formula (4'-2)

wherein, in formulae (4'-1) and (4'-2), Y represents a halogen atom, an alkyl group, an alkoxy group, a cyano group, an amide group, an alkoxycarbonyl group, or a thioalkyl group, and n represents an integer of 0 to 7.

With respect to the "halogen atom", preferred are a fluorine atom, a chlorine atom, a bromine atom, and an iodine atom, and especially preferred are a fluorine atom and a chlorine atom.

The "alkyl group" in the present invention includes a linear, branched, or cyclic alkyl group.

Examples of linear, branched, or cyclic saturated alkyl groups include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a n-hexyl group, a n-heptyl group, a n-octyl group, a n-nonyl group, a n-decanyl group, a n-undecanyl group, a n-dodecanyl group, a n-tridecanyl group, a n-tetradecanyl group, a n-pentadecanyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group. The number of carbon atoms of the alkyl group is 1 to 3, 1 to 6, 1 to 8, 1 to 10, or 1 to 15 in the order of preference.

The alkoxy group includes a group corresponding to the above-mentioned alkyl group having an ether oxygen atom (—O—) bonded to the carbon atom at the end thereof. Examples of such alkoxy groups include a methoxy group, an ethoxy group, a n-propoxy group, an i-propoxy group, a cyclopropoxy group, a n-butoxy group, an i-butoxy group, a s-butoxy group, a t-butoxy group, a cyclobutoxy group, a 1-methyl-cyclopropoxy group, a 2-methyl-cyclopropoxy group, a n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a 1,1-diethyl-n-propoxy group, a cyclopentoxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, and a 2-ethyl-cyclopropoxy group. The structure of the alkoxy group is preferably a linear chain or a branched chain. The number of carbon atoms of the alkoxy group is 1 to 3, 1 to 6, 1 to 8, 1 to 10, or 1 to 15 in the order of preference.

The amide group includes a group of —CONR$^1$R$^2$, wherein R$^1$ and R$^2$ are a hydrogen atom or the above-mentioned alkyl group.

The alkoxycarbonyl group includes a group corresponding to the above-mentioned alkoxy group having a carbonyl group (—CO—) bonded to the carbon atom at the end thereof. The structure of the alkoxycarbonyl group is preferably a linear chain or a branched chain. Examples of such alkoxycarbonyl groups include a methoxycarbonyl group, an ethoxycarbonyl group, a n-propoxycarbonyl group, an isopropoxycarbonyl group, a n-butoxycarbonyl group, an isobutoxycarbonyl group, a sec-butoxycarbonyl group, a tert-butoxycarbonyl group, a n-pentyloxycarbonyl group, and a n-hexyloxycarbonyl group.

The thioalkyl group includes a group corresponding to the above-mentioned alkoxy group having —S— in place of —O—. Examples of such thioalkyl groups include a methylthio group, an ethylthio group, a n-propylthio group, an i-propylthio group, a n-butylthio group, an i-butylthio group, a s-butylthio group, a t-butylthio group, a 2-methylbutylthio group, a n-pentylthio group, and a n-hexoxy group.

More preferred examples of the aromatic group-containing vinyl compounds containing no hydroxy group include 2-vinylnaphthalene, styrene, and 4-methoxystyrene.

1.1.3. Compound Containing (a)an (Meth)Acryloyl Group and Containing No Hydroxy Group The "(meth)acryloyl group" is an expression for referring to both an acryloyl group and a methacryloyl group. The acryloyl group indicates a group represented by $CH_2=CH-CO-$, and the methacryloyl group indicates a group represented by $CH_2=C(R)-CO-$ (wherein R is, e.g., a hydrocarbon group).

Preferred are compounds represented by formulae (5'-1) and (5'-2):

[Chemical formula 13]

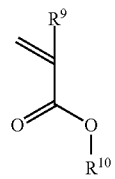

Formula (5'-1)

[Chemical formula 14]

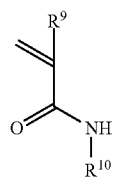

Formula (5'-2)

wherein, in formulae (5'-1) and (5'-2), $R^9$ represents a hydrogen atom or a methyl group, and $R^{10}$ independently represents a hydrogen atom, an alkoxy group having 1 to 5 carbon atoms, a linear, branched, or cyclic alkyl group having 1 to 10 carbon atoms, which is optionally substituted with a halogen atom, a benzyl group, or an anthrylmethyl group.

The "alkoxy group", "halogen atom", and "alkyl group" are as described above.

Examples of compounds containing (a)an (meth)acryloyl group and containing no hydroxy group include methyl (meth)acrylate, ethyl (meth)acrylate, n-hexyl (meth)acrylate, isopropyl (meth)acrylate, cyclohexyl (meth)acrylate, benzyl (meth)acrylate, anthrylmethyl (meth)acrylate, 2,2,2-trifluoroethyl (meth)acrylate, 2,2,2-trichloroethyl (meth)acrylate, 2-bromoethyl (meth)acrylate, 2-methoxyethyl (meth)acrylate, butoxy(2-ethyl) (meth)acrylate, 2-methyl-2-adamantyl (meth)acrylate, (meth)acrylamide, N-methyl (meth)acrylamide, N-ethyl(meth)acrylamide, N-benzyl (meth)acrylamide, and N-anthryl(meth)acrylamide. More preferred is benzyl methacrylate.

1.1.4. Crosslink-Forming Group-Containing Compound

There is no particular limitation to the crosslink-forming group as long as it is a group capable of forming a chemical bond between the molecules. The crosslink-forming group may be, for example, a hydroxy group, an epoxy group, a protected hydroxy group, or a protected carboxyl group. The compound may contain any number of crosslink-forming groups in the molecule.

Examples of hydroxy groups include a vinyl group-containing hydroxy group derived from, for example, a hydroxyalkyl (meth)acrylate or vinyl alcohol, and a phenolic hydroxy group such as that of hydroxystyrene. The alkyl groups include the above alkyl groups, such as a methyl group, an ethyl group, a propyl group, an isopropyl group, and a butyl group. In the present specification, the "(meth) acrylate" refers to both methacrylate and acrylate.

Examples of epoxy groups include a vinyl group-containing epoxy group derived from, for example, epoxy (meth) acrylate or glycidyl (meth)acrylate.

The protected hydroxy group includes a group corresponding to a hydroxy group of hydroxystyrene, which is protected by a tertiarybutoxy (tert-butoxy) group.

Further, it includes a protected hydroxy group obtained by reacting a phenolic hydroxy group of, for example, hydroxystyrene with a vinyl ether compound, and a protected hydroxy group obtained by reacting an alcoholic hydroxy group of, for example, hydroxyethyl methacrylate with a vinyl ether compound. Examples of vinyl ether compounds include aliphatic vinyl ether compounds having an alkyl chain having 1 to 10 carbon atoms and a vinyl ether group, such as methyl vinyl ether, ethyl vinyl ether, isopropyl vinyl ether, normalbutyl vinyl ether, 2-ethylhexyl vinyl ether, tert-butyl vinyl ether, and cyclohexyl vinyl ether, and cyclic vinyl ether compounds, such as 2,3-dihydrofuran, 4-methyl-2,3-dihydrofuran, and 2,3-dihydro-4H-pyran.

The protected carboxyl group includes a protected carboxyl group obtained by reacting a carboxyl group of (meth)acrylic acid or vinylbenzoic acid with a vinyl ether compound. Examples of the vinyl ether compound used for the protected group include the above vinyl ether compounds.

Preferred are compounds represented by formulae (2'-1), (2'-2), (3'-1), and (3'-2):

[Chemical formula 15]

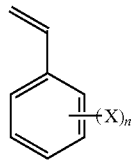

Formula (2'-1)

-continued

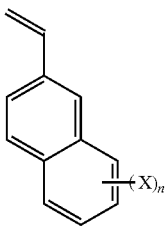

Formula (2'-2)

wherein, in formulae (2'-1) and (2'-2), each of n quantity of X independently represents a hydroxy group, a halogen atom, an alkyl group, an alkoxy group, a cyano group, an amide group, an alkoxycarbonyl group, or a thioalkyl group, with which the aromatic ring is substituted, and n represents an integer of 1 to 7, and, in a preferred embodiment, at least one of X is a hydroxy group,

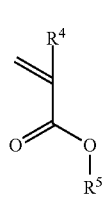

Formula (3'-1)

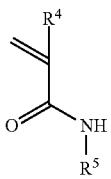

Formula (3'-2)

wherein, in formulae (3'-1) and (3'-2), $R^4$ represents a hydrogen atom or a methyl group, and $R^5$ represents a linear, branched, or cyclic alkyl group having 1 to 10 carbon atoms, which has a hydroxy group and is optionally substituted with a halogen atom, or a hydroxyphenyl group.

The "halogen atom", "alkyl group", "alkoxy group", "amide group", "alkoxycarbonyl group", and "thioalkyl group" are as described above.

More preferred are 2-hydroxypropyl methacrylate, 2-hydroxyethyl methacrylate, N-(4-hydroxyphenyl)methacrylamide, 2-hydroethyl acrylate, 2-hydroxypropyl methacrylate, and 4-hydroxybutyl (meth)acrylate.

The above-mentioned monomers can be produced by a method commonly used, or are commercially available.

1.2. Polymerization Initiator

With respect to the polymerization initiator, an organic peroxide or a diazo compound may be used.

Examples of organic peroxides include diacyl peroxides, such as diacetyl peroxide, diisobutyl peroxide, didecanoyl peroxide, benzoyl peroxide, and succinyl peroxide; peroxydicarbonates, such as diisopropyl peroxydicarbonate, di-2-ethylhexyl peroxydicarbonate, and diallyl peroxydicarbonate; peroxy esters, such as tert-butyl peroxyisobutyrate, tert-butyl neodecanoate, and cumene peroxyneodecanoate; and sulfonate peroxides, such as acetylcyclohexylsulfonyl peroxide.

Examples of diazo compounds include 2,2'-azobisisobutyronitrile, 4,4'-azobis(4-cyanovaleric acid), 2,2'-azobis(4-methoxy-2,4-dimethoxyvaleronitrile), and 2,2'-azobis(2-cyclopropylpropionitrile).

For the purpose of terminating the polymerization in a short time, a compound having a decomposition half-life of 10 hours or less at 80° C. is preferred, and, of the above compounds, preferred are benzoyl peroxide and 2,2'-azobisisobutyronitrile, and most preferred is 2,2'-azobisisobutyronitrile.

The amount of the polymerization initiator used is generally 0.0001 to 0.2 equivalent, preferably 0.0005 to 0.1 equivalent, relative to the all monomers used.

1.3. Solvent

There is no particular limitation to the solvent used in the present invention as long as it does not participate in the polymerization reaction and is compatible with the polymer. Specifically usable are an aromatic hydrocarbon, such as benzene, toluene, or xylene; an alicyclic hydrocarbon, such as cyclohexane; an aliphatic hydrocarbon, such as n-hexane or n-octane; a ketone, such as acetone, methyl ethyl ketone, or cyclohexanone; an ether, such as tetrahydrofuran or dioxane; an ester, such as ethyl acetate or butyl acetate; an amide, such as N,N-dimethylformamide or N,N-dimethylacetamide; a sulfoxide, such as dimethyl sulfoxide; an alcohol, such as methanol or ethanol; or a polyhydric alcohol derivative, such as ethylene glycol monomethyl ether, ethylene glycol monomethyl ether acetate, or propylene glycol monomethyl ether acetate. These solvents may be used alone or in combination in the form of a mixed solvent, and the amount of solvent used may be appropriately selected.

1.4. Conditions for Reaction

The molar ratio of the above monomers charged is selected so that the resultant copolymer has a copolymerization ratio of: (A) 25 to 90% by mole, (B) 0 to 65% by mole, (C) 0 to 65% by mole, and (D) 10 to 20% by mole, and that the copolymer has a proportion of an amount of unit structures containing an aromatic group based on a total amount of unit structures (A), (B), and (C) of 81 to 90% by mole. When the copolymerization ratio for unit structure (A) is less than 25% by mole, the block copolymer is not vertically oriented, and, when the copolymerization ratio for unit structure (A) is 91% by mole or more, required cross-linked units cannot be introduced. Here, (A) indicates a unit structure derived from a styrene compound containing a tert-butyl group; (B) indicates a unit structure derived from an aromatic group-containing vinyl compound containing no hydroxy group, which differs from unit structure (A); (C) indicates a unit structure derived from a compound containing (a)an (meth)acryloyl group and containing no hydroxy group; and (D) indicates a unit structure derived from a crosslink-forming group-containing compound. There is no particular limitation to the polymerization temperature in the present invention as long as the temperature is in such a range that a side reaction, such as a chain transfer reaction or a termination reaction, does not occur and the monomers are consumed to complete the polymerization. The polymerization is preferably conducted at a temperature not lower than −100° C. and not higher than the boiling point of the solvent. Also, there is no particular limitation to the concentration of the monomers in the solvent. The monomer concentration is usually 1 to 40% by weight, preferably 10 to 30% by weight. The period of time for the polymerization reaction may be appropriately selected, but it falls usually within the range of from 2 to 50 hours.

1.5. Copolymer

Thus, there is obtained a copolymer having:
(A) a unit structure derived from a styrene compound containing a tert-butyl group,
(B) a unit structure derived from an aromatic group-containing vinyl compound containing no hydroxy group, which differs from unit structure (A),
(C) a unit structure derived from a compound containing (a)an (meth)acryloyl group and containing no hydroxy group, and
(D) a unit structure derived from a crosslink-forming group-containing compound,
  wherein the copolymer has a copolymerization ratio of: (A) 25 to 90% by mole, (B) 0 to 65% by mole, (C) 0 to 65% by mole, and (D) 10 to 20% by mole, and
  wherein the copolymer has a proportion of an amount of unit structures containing an aromatic group based on a total amount of unit structures (A), (B), and (C) of 81 to 90% by mole.

The proportion of amount of unit structures containing an aromatic group based on the total amount of unit structures (A), (B), and (C) preferably ranges from 82 to 89% by mole, more preferably from 83 to 88% by mole, most preferably from 83 to 86% by mole.

The weight average molecular weight of the copolymer, as measured by a GPC (gel permeation chromatography) method, may vary depending on, for example, the application solvent used and the solution viscosity. It is, for example, 1,000 to 50,000, preferably 2,000 to 20,000, in terms of a molecular weight determined using a conversion calibration curve obtained from the polystyrene. Specific examples of copolymers are disclosed in the Synthesis Examples described below.

2. Preparation of the Composition

An additive is added to the thus obtained copolymer and the resultant mixture is dissolved in an appropriate solvent to obtain the underlayer film-forming composition of the present invention. Preferably, the composition, after dissolved in the above solvent, is further subjected to filtration using a microfilter; more preferably, the composition, after dissolved in the above solvent, is further subjected to filtration using a microfilter having a pore diameter of 0.2 μm or less; and most preferably, the composition is further subjected to filtration using a microfilter having a pore diameter of 0.2 μm.

2.1. Copolymer Component

Although a copolymer may be isolated from the above-obtained copolymer solution and then used in the preparation of an underlayer film-forming composition, the above-obtained copolymer solution may be used as such in the underlayer film-forming composition.

2.2. Additives

The underlayer film-forming composition of the present invention may further contain a crosslinkable compound and a sulfonic acid compound. The sulfonic acid compound functions as a crosslinking accelerator. There is no particular limitation to the proportion of the sulfonic acid compound to the copolymer contained in the underlayer film-forming composition of the present invention. For example, the proportion of the sulfonic acid compound ranges from 0.1 to 13% by mass, preferably 0.5 to 5% by mass. The crosslinkable compound is also referred to as a crosslinking agent, and an example thereof is a nitrogen-containing compound having 2 to 4 nitrogen atoms, which is substituted with a methylol group or an alkoxymethyl group. There is no particular limitation to the proportion of the crosslinkable compound to the copolymer contained in the underlayer film-forming composition of the present invention. For example, the proportion ranges from 5 to 50% by mass.

Specific preferred examples of the sulfonic acid compounds include p-toluenesulfonic acid, 4-hydroxybenzenesulfonic acid, trifluoromethanesulfonic acid, pyridinium p-toluenesulfonate, pyridinium 4-hydroxybenzenesulfonate, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, and pyridinium 1-naphthalenesulfonate.

Specific preferred examples of the crosslinkable compounds (crosslinking agents) include hexamethoxymethylmelamine, tetramethoxymethylglycoluril, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea, and more preferred is tetramethoxymethylglycoluril, and most preferred is 1,3,4,6-tetrakis(methoxymethyl)glycoluril.

The underlayer film-forming composition of the present invention may contain a surfactant. The surfactant is an additive for improving the application properties to a substrate. A known surfactant, such as a nonionic surfactant or a fluorine surfactant, may be used. It may be added in an amount of, for example, 0.1 to 5% by mass based on the mass of the copolymer contained in the underlayer film-forming composition of the present invention.

In the underlayer film-forming composition of the present invention, when the component that would remain after removing the solvent from the composition is defined as solids, the solids include the copolymer and the above-mentioned various additives optionally added.

The concentration of the solid in the underlayer film-forming composition ranges, for example, from 0.1 to 15% by mass, preferably from 0.1 to 10% by mass.

2.3. Solvent

Specific examples of solvents contained in the underlayer film-forming composition of the present invention include propylene glycol monomethyl ether (PGME), propylene glycol monomethyl ether acetate (PGMEA), propylene glycol monopropyl ether, methyl ethyl ketone, ethyl lactate, cyclohexanone, N,N-2-trimethylpropionamide, γ-butyrolactone, N-methylpyrrolidone, methyl 2-hydroxyisobutyrate, ethyl 3-ethoxypropionate, and mixtures of two or more solvents selected from these solvents. The solvent used in the preparation of the copolymer may be contained as such in the composition.

There is no particular limitation to the proportion of the solvent in the underlayer film-forming composition of the present invention. For example, the proportion is not lower than 90% by mass and not higher than 99.9% by mass.

3. Method for Producing Phase-Separated Pattern of Block Copolymer

The method for producing a phase-separated pattern of a block copolymer of the present invention comprises the steps of: (1) forming an underlayer film on a substrate using the underlayer film-forming composition of the present invention; (2) forming a block copolymer layer on the underlayer film; and (3) causing the block copolymer layer formed on the underlayer film to suffer phase separation.

The method may further comprise, between step (2) of forming a block copolymer layer and step (3) of causing the block copolymer layer to suffer phase separation, the step of forming an upper layer film on the block copolymer layer.

3.1. Step of Forming Underlayer Film on Substrate 3.1.1. Substrate

The substrate is composed of a material selected from the group consisting of silicon, silicon oxide, glass, surface-modified glass, a plastic, a ceramic, a transparent material, a flexible material, a material used in roll-to-roll processing, and combinations thereof. Preferred is a silicon wafer, quartz, glass, or a plastic, and more preferred is a silicon wafer. The semiconductor substrate is representatively a silicon wafer, but an SOI (silicon on insulator) substrate, or a compound semiconductor wafer, such as gallium arsenide (GaAs), indium phosphide (InP), or gallium phosphide (GaP), may be used. A semiconductor substrate having formed thereon an insulating film, such as a silicon oxide film, a nitrogen-containing silicon oxide film (SiON film), or a carbon-containing silicon oxide film (SiOC film), may also be used, and, in such a case, the underlayer film-forming composition of the present invention is applied onto the insulating film.

3.1.2. Step of Forming Underlayer Film

An underlayer film is formed on the substrate in order to obtain neutral surface energy. The underlayer film-forming composition is applied onto the substrate by a method commonly used, such as spin coating, so that the resultant film has a predetermined thickness, and then, as occasion demands, subjected to, for example, heating or immersion.

The application of the underlayer film-forming composition of the present invention may be conducted by a method commonly used, and the composition may be applied by an appropriate application method, for example, using a spinner or a coater.

The obtained film applied is baked to form an underlayer film. Baking conditions are appropriately selected within the baking temperature range of 80 to 500° C., or 80 to 350° C. and within the baking time range of 0.3 to 60 minutes. Preferred conditions are at a baking temperature of 100 to 250° C. for a baking time of 0.5 to 2 minutes. The underlayer film formed has a thickness of, for example, 10 to 1,000 nm, or 20 to 500 nm, or 50 to 300 nm, or 100 to 200 nm, or 10 to 100 nm.

3.2. Step of Forming Block Copolymer Layer on the Underlayer Film

A block copolymer layer is formed on the underlayer film. The formation of the block copolymer layer may be conducted by a method commonly used, for example, by applying a self-organized film-forming composition containing a block copolymer onto the lower film layer by a method, such as spin coating, so that the resultant film has a predetermined thickness, followed by baking the film.

The self-organized film-forming composition may have a solid content of 0.1 to 10% by mass, or 0.1 to 5% by mass, or 0.1 to 3% by mass. The solid content refers to the content of the substances left behind the removal of the solvent from the film-forming composition.

The proportion of the block copolymer in the solid content may be 30 to 100% by mass, or 50 to 100% by mass, or 50 to 90% by mass, or 50 to 80% by mass.

Two or three or more types of block may be present in the block copolymer. Further, two or three or more blocks may be present in the block copolymer.

With respect to the block polymer, examples of combination of blocks include AB, ABAB, ABA, and ABC.

A method for synthesizing the block copolymer would be to obtain the same by living radical polymerization or living cationic polymerization, of which the polymerization process is comprised of only an initiation reaction and a propagation reaction, without being accompanied by a side reaction that deactivates the propagation end. The propagation end can maintain a propagation activating reaction during the polymerization reaction. By inhibiting chain transfer, polymer (A) having a uniform length can be obtained. By adding another monomer (b) while using the propagation end of polymer (A), the polymerization proceeds in the presence of monomer (b) to form a block copolymer (AB).

For example, when two types of block, i.e., blocks A and B, are present, the molar ratio of polymer chain (A) and polymer chain (B) can be 1:9 to 9:1, preferably 3:7 to 7:3.

The volume ratio in the block copolymer of the present invention ranges, for example, from 30:70 to 70:30.

Homopolymer A or B is a polymerizable compound having at least one radically polymerizable reactive group (vinyl group or vinyl group-containing organic group).

The weight average molecular weight Mw of the block copolymer used in the present invention ranges preferably from 1,000 to 100,000, or from 5,000 to 100,000. When the weight average molecular weight Mw of the block copolymer is less than 1,000, the application properties to the substrate are likely to be poor, and, when the weight average molecular weight Mw of the block copolymer is 100,000 or more, the solubility of the block copolymer in a solvent is likely to be poor.

The polydisperse degree (Mw/Mn) of the block copolymer in the present invention ranges preferably from 1.00 to 1.50, especially preferably from 1.00 to 1.20.

As a specific example of the block copolymer, when a silicon-non-containing polymer chain and a silicon-containing polymer chain such as a polysilane, e.g., polydihexylsilane, a polysiloxane, e.g., polydimethylsiloxane, or a silylated polystyrene derivative, e.g., poly(trimethylsilylstyrene) or poly(pentamethyldisilylstyrene) are combined, for example, the difference in dry etching rate between the chains can be advantageously increased.

Particularly, as the above-mentioned silylated polystyrene derivative, poly(4-trimethylsilylstyrene) and poly(4-pentamethyldisilylstyrene), which have a substituent at the 4-position, are preferable.

The block copolymer preferably used in the present invention is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure derived from a lactide are bound.

Of these, a combination of a silylated polystyrene derivative and a polystyrene derivative polymer, or a combination of a silylated polystyrene derivative polymer and polylactide is preferred.

Of these, a combination of a silylated polystyrene derivative having a substituent at the 4-position and a polystyrene derivative polymer having a substituent at the 4-position, or a combination of a silylated polystyrene derivative polymer having a substituent at the 4-position and polylactide is preferred.

More preferred specific examples of block copolymers include a combination of poly(trimethylsilylstyrene) and polymethoxystyrene, a combination of polystyrene and poly(trimethylsilylstyrene), and a combination of poly(trimethylsilylstyrene) and poly(D,L-lactide).

More preferred specific examples of block copolymers include a combination of poly(4-trimethylsilyl styrene) and poly(4-methoxy styrene), a combination of polystyrene and poly(4-trimethylsilylstyrene), and a combination of poly(4-trimethylsilyl styrene) and poly(D,L-lactide).

Most preferred specific examples of block copolymers include a poly(4-methoxystyrene)/poly(4-trimethylsilylstyrene) copolymer and a polystyrene/poly(4-trimethylsilylstyrene) copolymer.

Examples of organic solvents used in the self-organized film-forming composition include aliphatic hydrocarbon solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketone solvents, such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformami de, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propane sultone.

Particularly, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferred in view of the storage stability of the solution of the composition.

Thus, there is obtained an underlayer film for use in causing a layer comprising a block copolymer formed on a substrate to suffer phase separation, wherein the underlayer film comprises a copolymer having:

(A) a unit structure derived from a styrene compound containing a tert-butyl group,
(B) a unit structure derived from an aromatic group-containing vinyl compound containing no hydroxy group, which differs from unit structure (A),
(C) a unit structure derived from a compound containing (a)an (meth)acryloyl group and containing no hydroxy group, and
(D) a unit structure derived from a crosslink-forming group-containing compound,
  wherein the copolymer has a copolymerization ratio of: (A) 25 to 90% by mole, (B) 0 to 65% by mole, (C) 0 to 65% by mole, and (D) 10 to 20% by mole, and
  wherein the copolymer has a proportion of an amount of unit structures containing an aromatic group based on a total amount of unit structures (A), (B), and (C) of 81 to 90% by mole.

The proportion of the amount of the unit structures containing an aromatic group based on the total amount of unit structures (A), (B), and (C) is preferably 82 to 89% by mole, more preferably 83 to 88% by mole, most preferably 83 to 86% by mole.

3.3. Step of Forming Upper Layer Film on the Block Copolymer Layer

Optionally, an upper layer film is formed on the above-obtained block copolymer layer. The formation of the upper-layer film may be conducted by a well-known method, namely, application of an upper layer film-forming composition onto the underlayer film followed by baking.

The upper-layer film-forming composition is applied onto the block copolymer layer by a method commonly used, such as spin coating, to form an upper layer film. The thickness of the formed upper layer film is not particularly limited, but generally falls within the range of from 3 to 100 nm, preferably from 10 to 70 nm, especially preferably from 20 to 60 nm. When the thickness of the upper layer film is 3 nm or less, a desired uniform block copolymer phase-separated pattern sometimes cannot be formed. When the thickness of the upper layer film is 100 nm or more, a considerably prolonged time is sometimes disadvantageously needed for etching. The upper-layer film-forming composition is preferably dissolved in a solvent or solvent mixture which does not damage the block copolymer, does not dissolve the block copolymer and does not substantially swell the block copolymer.

The upper-layer film-forming composition which is suitable for practicing the present invention is described below.

[Upper-Layer Film-Forming Composition]

The upper-layer film-forming composition suitable for practicing the present invention is an upper-layer film-forming composition for use in causing a layer comprising a block copolymer formed on a substrate to suffer phase separation, wherein the upper-layer film-forming composition comprises, for example, (A) a copolymer comprising (a) a unit structure derived from a maleimide structure and a unit structure derived from a styrene structure, and (B) an ether compound having 8 to 16 carbon atoms as a solvent.

This composition may be used as an upper-layer film-forming composition such that the composition is applied onto a block copolymer thin film to form an upper-layer film, and the resultant upper-layer film and the block copolymer thin film are heated to control the orientation of the block copolymer, followed by the removal of the upper-layer film. A block copolymer layer which cannot be oriented merely by heating can be oriented by using an upper-layer film formed from this composition.

[(A) Copolymer]

[Copolymer Comprising (a) Unit Structure Derived from Maleimide Structure and Unit Structure Derived from Styrene Structure]

In the present description, the terms "maleimide structure" and "styrene structure" mean chemical structures having maleimide and styrene, respectively, as the skeleton. The wording "unit structure derived from" a maleimide structure or styrene structure means a repeating unit constituting the main chain of the copolymer, which is derived from a compound having the above-mentioned maleimide structure or styrene structure while maintaining the skeleton of the compound.

Preferably, the unit structure derived from a maleimide structure is represented by formula (11):

[Chemical formula 19]

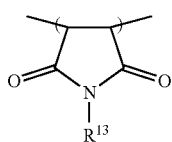

Formula (11)

wherein $R^{11}$ represents a hydrogen atom, a linear, branched, or cyclic alkyl group having 1 to 10 carbon atoms, or an aryl group having 6 to 10 carbon atoms optionally substituted with a halogen atom.

Preferably, the unit structure derived from a styrene structure is represented by formula (12):

[Chemical formula 20]

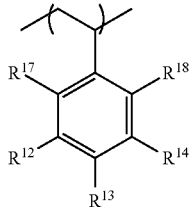

Formula (12)

wherein each of $R^{12}$ to $R^{14}$, $R^{17}$, and $R^{18}$ independently represents a hydrogen atom, an alkoxy group having 1 to 5 carbon atoms, or a linear, branched, or cyclic alkyl group having 1 to 10 carbon atoms optionally substituted with a halogen atom. $R^7$ and $R^8$ are preferably a hydrogen atom.

Preferably, the molar ratios of the unit structures represented by formula (11) and formula (12) to the total unit structures in copolymer (A) are as follows:
structural unit of formula (11): 30 to 70% by mole, and
structural unit of formula (12): 20 to 50% by mole,
based on the total unit structures of copolymer (A).

[(b) Unit Structure Derived from (Meth)Acryl Group]

In addition to formula (11) and formula (12), copolymer (A) may further comprise (b) a unit structure derived from (a)an (meth)acryl group.

In the present invention, the "(meth)acryl group" means both an acryl group and a methacryl group. The "(meth) acrylate compound" means both an acrylate compound and a methacrylate compound. For example, (meth)acrylic acid means acrylic acid and methacrylic acid.

Preferably, the unit structure derived from (a)an (meth) acryl group is represented by formula (13):

[Chemical formula 21]

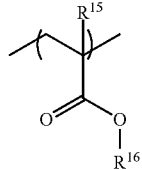

Formula (13)

wherein each of $R^{15}$ and $R^{16}$ independently represents a hydrogen atom, an alkoxy group having 1 to 5 carbon atoms, or a linear, branched, or cyclic alkyl group having 1 to 10 carbon atoms optionally substituted with a halogen atom.

The molar ratio of the unit structure of formula (13) to the total unit structures of copolymer (A) ranges from 0.1 to 50% by mole, more preferably from 0.1 to 30% by mole, further preferably 0.1 to 20% by mole, most preferably 0.1 to 10% by mole, based on the total unit structures of copolymer (A).

In formulae (11), (12), and (13) above, examples of aryl groups having 6 to 10 carbon atoms include a phenyl group, a benzyl group, and a naphthyl group.

There is no particular limitation to the manner of distribution of the unit structures represented by formulae (11), (12), and (13) in copolymer (A). Specifically, in copolymer (A), the unit structures represented by formulae (11) and (12) may be alternating-copolymerized or random-copolymerized. When the unit structure represented by formula (13) coexists, each of the unit structures represented by formulae (11), (12), and (13) in copolymer (A) may constitute blocks, or may be randomly bonded to each other.

The number of repetition of the unit structures represented by formulae (11), (12), and (13) in copolymer (A) may be appropriately selected so that the molar percentage of the unit structures falls within the above-mentioned range and that the weight average molecular weight Mw of copolymer (A) falls within the range of from 5,000 to 500,000, preferably 10,000 to 100,000.

[Method for Producing Copolymer (A)]

A method for producing copolymer (A), which is suitable for practicing the present invention, comprises the step of subjecting a monomer mixture containing a compound represented by formula (14):

[Chemical formula 22]

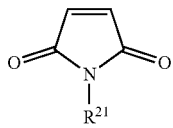

Formula (14)

wherein R represents a hydrogen atom, a linear, branched, or cyclic alkyl group having 1 to 10 carbon atoms, or an aryl group having 6 to 10 carbon atoms optionally substituted with a halogen atom;

and a compound represented by formula (15):

[Chemical formula 23]

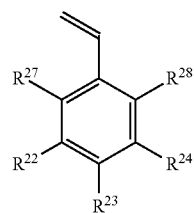

Formula (15)

wherein each of $R^{22}$ to $R^{24}$, $R^{27}$, and $R^{28}$ independently represents a hydrogen atom, an alkoxy group having 1 to 5 carbon atoms, or a linear, branched, or cyclic alkyl group having 1 to 10 carbon atoms optionally substituted with a halogen atom;

to copolymerization. $R^9$ and $R^{10}$ are preferably a hydrogen atom.

Into the monomer mixture, a compound represented by formula (16):

[Chemical formula 24]

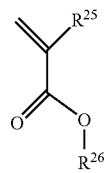

Formula (16)

wherein each of $R^{25}$ and $R^{26}$ independently represents a hydrogen atom, an alkoxy group having 1 to 5 carbon atoms, or a linear, branched, or cyclic alkyl group having 1 to 10 carbon atoms optionally substituted with a halogen atom may optionally be incorporated.

The "alkyl group", "aryl group", "alkoxy group", and "halogen atom" are as described above.

The monomer mixture preferably contains the compounds represented by formula (14) and formula (15) in the following proportion:

the compound represented by formula (14): 30 to 70% by mole, and the compound represented by formula (15): 20 to 50% by mole, based on the total monomers for copolymer (A).

When a compound represented by formula (16) is incorporated, the monomer mixture preferably contains the compounds in the following proportion:

the compound represented by formula (14): 30 to 70% by mole, the compound represented by formula (15): 20 to 50% by mole, and the compound represented by formula (16): 0.1 to 40% by mole, based on the total monomers for copolymer (A).

Specific examples of compounds represented by formula (14) include:

[Chemical formula 25]

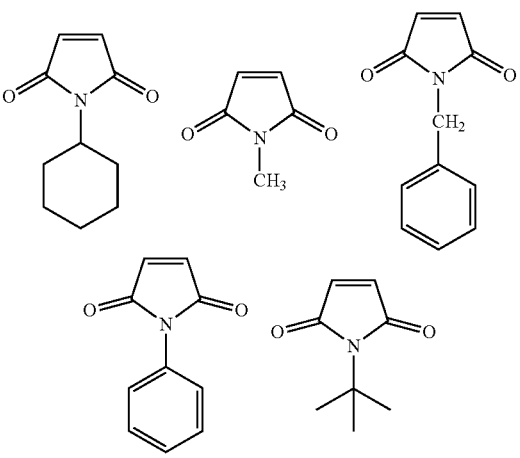

Specific examples of compounds represented by formula (15) include:
[Chemical formula 26]
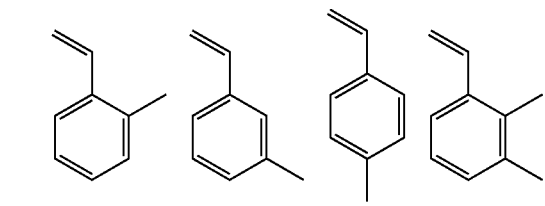
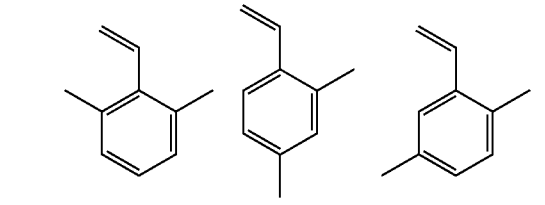
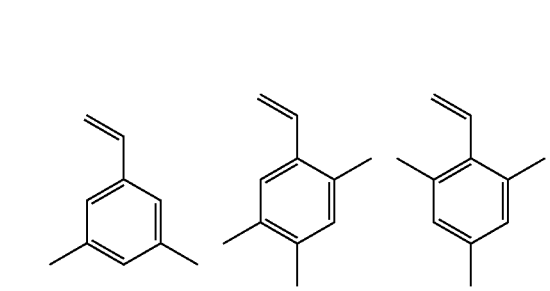
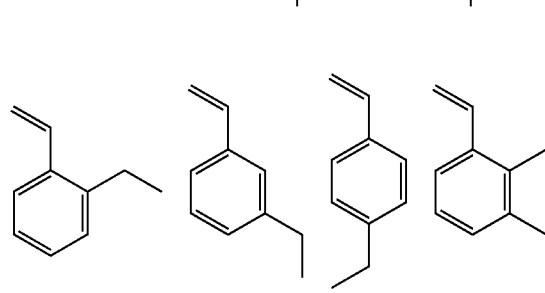
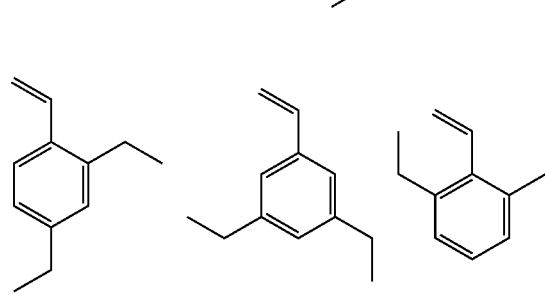
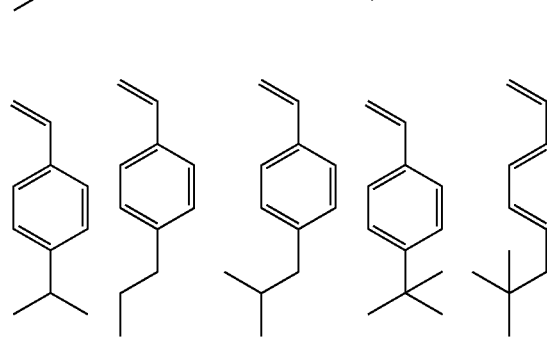
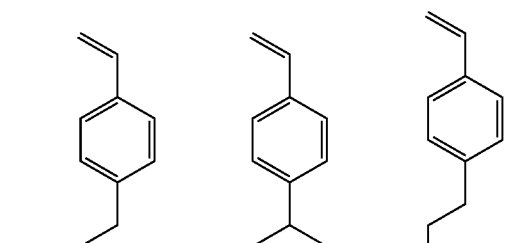
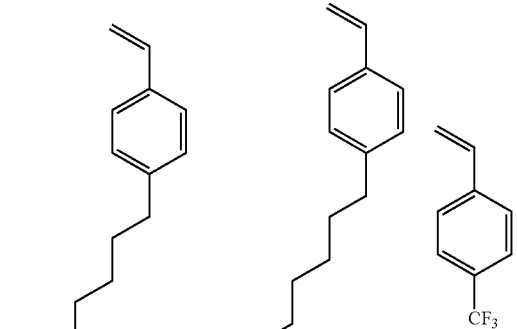
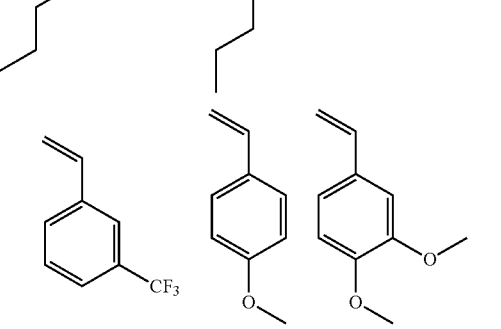
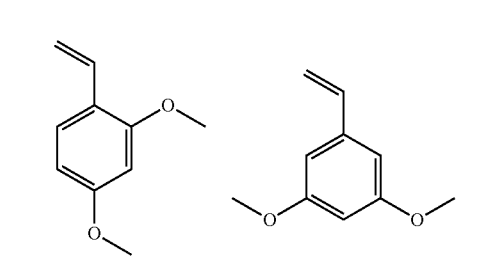
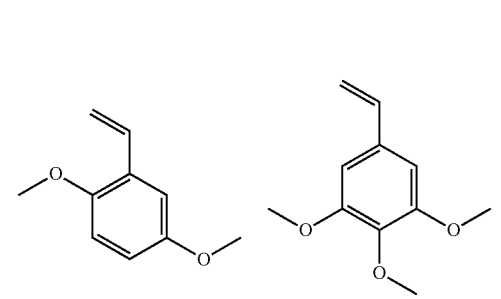

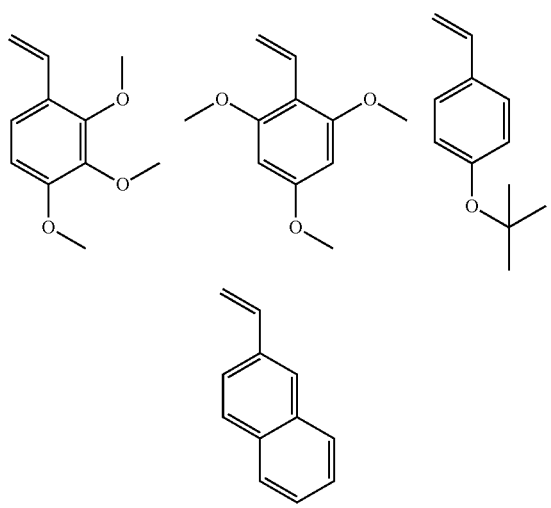

Specific examples of compounds represented by formula (16) include:

[Chemical formula 27]

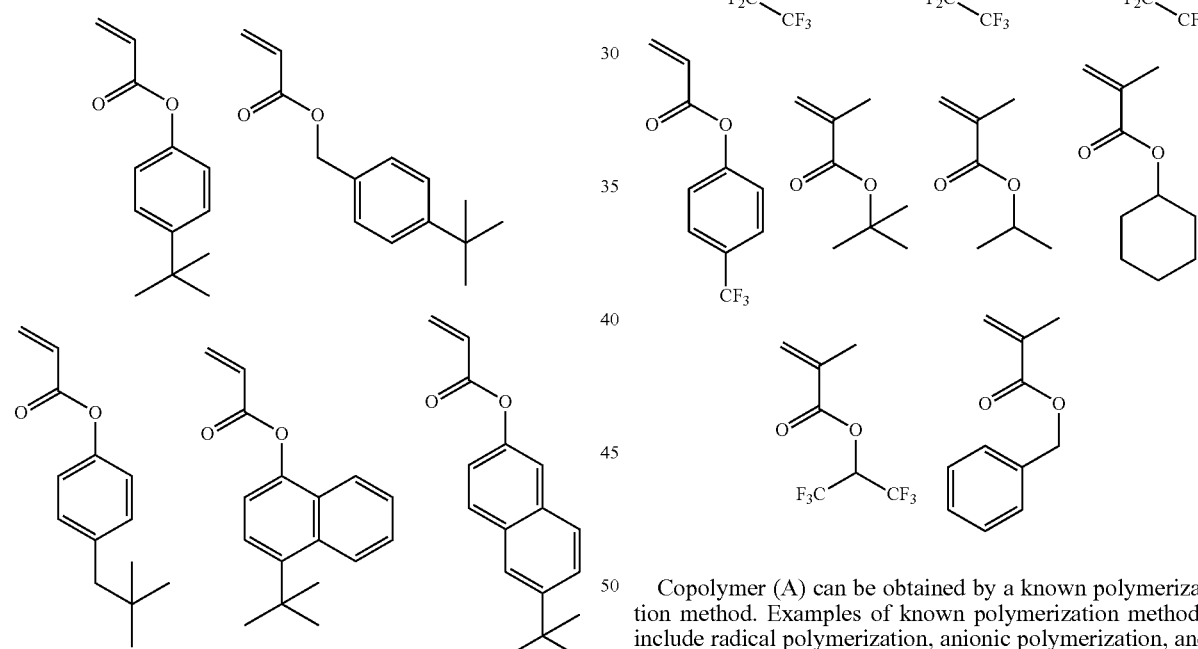

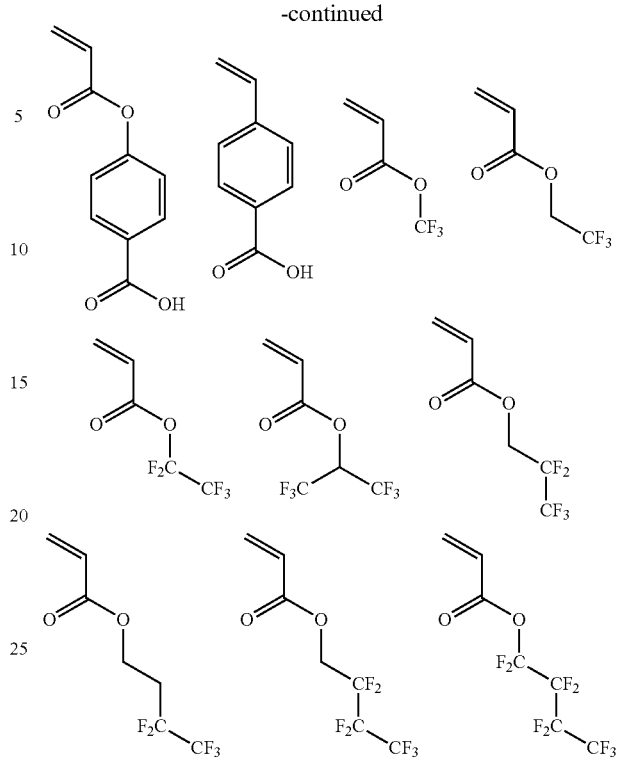

Copolymer (A) can be obtained by a known polymerization method. Examples of known polymerization methods include radical polymerization, anionic polymerization, and cationic polymerization. Various known techniques, such as solution polymerization, suspension polymerization, emulsion polymerization, and bulk polymerization, may be used.

As a polymerization initiator used in the polymerization, for example, 2,2'-azobis(isobutyronitrile), 2,2'-azobis(2-methylbutyronitrile), 2,2'-azobis(2,4-dimethylvaleronitrile), 4,4'-azobis(4-cyanovaleric acid), 2,2'-azobis(2,4-dimethylvaleronitrile), 2,2'-azobis(4-methoxy-2,4-dimethylvaleronitrile), 2,2'-azobis(isobutyronitrile), 1,1'-azobis(cyclohexane-1-carbonitrile), 1-[(1-cyano-1-methylethyl)azo]formamide, 2,2'-azobis[2-(2-imidazolin-2-yl)propane] dihydrochloride, 2,2'-azobis[2-(2-imidazolin-2-yl)propane], or 2,2'-azobis(2-methylpropionamidine) dihydrochloride is used.

As a solvent used in the polymerization, for example, dioxane, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate may be used. These may be used alone or in combination.

Copolymer (A) which is suitable for practicing the present invention may be obtained by conducting the reaction while stirring under reaction conditions at 50 to 200° C. for 1 to 48 hours.

The thus obtained solution containing copolymer (A) may be used as such in preparing an upper-layer film-forming composition. Alternatively, copolymer (A) may be isolated by precipitation in a poor solvent, such as methanol, ethanol, isopropanol, or water, or a mixed solvent thereof, followed by the recovery and used.

The isolated copolymer (A) may be redissolved as such in the below-mentioned ether compound having 8 to 16 carbon atoms, or may be dried and then used. When copolymer (A) is dried, it is preferably dried under the drying conditions, for example, in an oven at 30 to 100° C. for 6 to 48 hours. It may be possible to recover copolymer (A), dissolving it again in the below-mentioned ether compound having 8 to 16 carbon atoms to prepare a composition suitable for practicing the present invention, and using the composition as an upper-layer film-forming composition.

The weight average molecular weight of copolymer (A) suitable for practicing the present invention, as measured by a gel permeation chromatography (GPC) method, may vary depending on, for example, the application solvent used and the solution viscosity; however, it falls within the range of, for example, from 5,000 to 500,000, preferably from 10,000 to 100,000, in terms of the molecular weight determined using a conversion calibration curve obtained from the polystyrene.

[(B) Solvent]

The solvent used in the composition suitable for practicing the present invention is an ether compound having 8 to 16 carbon atoms. More specifically, the ether compound having 8 to 16 carbon atoms used as the solvent in the composition suitable for practicing the present invention (hereinafter, sometimes referred to as "ether solvent") is represented by formula (6):

[Chemical formula 28]

Formula (6)

wherein each of $A_1$ and $A_2$ independently represents an optionally substituted linear, branched, or cyclic saturated alkyl group having 1 to 15 carbon atoms.

Of these, preferred solvents are dibutyl ether, diisobutyl ether, di-tert-butyl ether, dipentyl ether, diisoamyl ether, dihexyl ether, dioctyl ether, and cyclopentyl methyl ether, each having excellent balance between the solubility of copolymer (A) and the insolubility of the block copolymer which is suitable for practicing the present invention. Further preferred solvents are dibutyl ether, diisobutyl ether, and diisoamyl ether, and especially preferred is diisoamyl ether. These ether solvents may be used alone or in combination.

For example, for the convenience of the synthesis of copolymer (A) suitable for practicing the present invention, the above-mentioned ether solvent as well as an organic solvent below may be mixed into the composition. Such a solvent includes, for example, those mentioned above in the item for the method for producing copolymer (A). The solvent other than the ether solvent may be present in an amount of 0.01 to 13% by mass, based on the mass of the ether solvent.

[Additive]

The upper-layer film-forming composition suitable for practicing the present invention may further contain an additive, such as a surfactant or a rheology modifier.

If necessary, a rheology modifier, a surfactant and the like may be further added to the upper-layer film-forming composition suitable for practicing the present invention in addition to the above-mentioned components. The rheology modifier is added mainly for the purpose of improving the fluidity of the composition suitable for practicing the present invention. Specific examples of rheology modifiers include phthalate derivatives, such as dimethyl phthalate, diethyl phthalate, diisobutyl phthalate, dihexyl phthalate, and butylisodecyl phthalate; adipate derivatives, such as dinormalbutyl adipate, diisobutyl adipate, diisooctyl adipate, and octyldecyl adipate; maleate derivatives, such as dinormalbutyl maleate, diethyl maleate, and dinonyl maleate; oleate derivatives, such as methyl oleate, butyl oleate, and tetrahydrofurfuryl oleate; and stearate derivatives, such as normalbutyl stearate and glyceryl stearate. The rheology modifier is usually incorporated in an amount of less than 30% by mass, based on the mass of the composition suitable for practicing the present invention (100% by mass).

A surfactant may be incorporated into the upper-layer film-forming composition suitable for practicing the present invention for further improving the application properties to avoid surface unevenness and to prevent, for example, the occurrence of pinholes or striation. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylaryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, such as EFTOP EF301, EF303, EF352 (manufactured by Tohchem Products Co., Ltd.), MEGAFACE F171, F173 (manufactured by DIC Corporation), Fluorad FC430, FC431 (manufactured by Sumitomo 3M), AsahiGuard AG710, Surflon S-382, SC101, SC102, SC103, SC104, SC105, SC106 (manufactured by Asahi Glass Co., Ltd.), and Ftergent Series (manufactured by NEOS Company Limited); and organosiloxane polymer KP341 (manufactured by Shin-Etsu Chemical Co., Ltd.). The surfactant is incorporated in an amount of usually 0.2% by mass or less, preferably 0.1% by mass or less, based on the mass of the upper-layer film-forming composition suitable for practicing the present invention (100% by mass). The surfactant may be added alone or in combination of two or more.

The amount of copolymer (A) contained in the composition, in terms of solid content, is preferably 20% by mass or more, for example, 20 to 100% by mass, or 30 to 100% by mass. The solid content of the composition suitable for practicing the present invention ranges preferably from 0.1 to 50% by mass, more preferably from 0.3 to 30% by mass. The solids content indicates the amount of solid left behind the removal of the solvent component from the upper-layer film-forming composition.

The above-mentioned copolymer (A), an ether compound having 8 to 16 carbon atoms as a solvent, and optionally the above additives are mixed according to the above-mentioned formulation and stirred at, for example, room temperature to 40° C. to produce the upper-layer film-forming composition suitable for practicing the present invention.

3.4. Step of Causing the Block Copolymer Layer Formed on the Underlayer Film to Suffer Phase Separation Phase separation of the block copolymer layer may be conducted in the presence of the upper layer film by a treatment that causes reorientation of the block copolymer material, for example, a treatment with ultrasonic waves, a treatment with a solvent, or heat annealing. In many uses, it is desirable that phase separation of the block copolymer layer is achieved merely by heating or by so-called heat annealing. The heat annealing may be conducted in the air or in an inert gas under atmospheric pressure or a reduced pressure or under pressuring conditions.

There is no particular limitation to the conditions for the heat annealing. The heat annealing may be conducted preferably in the air at 180 to 300° C., especially preferably at 190 to 240° C., most preferably at 210° C.

There is no particular limitation to the time for the treatment. It takes usually 1 to 30 minutes, preferably 3 to 10 minutes.

Phase separation of the block copolymer layer forms block copolymer domains oriented substantially vertically on the surface of the substrate or underlayer film. The form of the domains is, for example, a lamellar form, a spherical form, or a cylindrical form. A gap between the domains is, for example, 50 nm or less. By the method of the present invention, a structure having a desired size, form, orientation, and periodic properties can be formed.

The upper layer film may be released after performing phase separation of the block copolymer layer. The release may be made using, for example, a solvent or solvent mixture (solvent for release) which does not damage the block copolymer, does not dissolve the block copolymer and does not substantially swell the block copolymer. The released upper layer film composition may be isolated and reused. The isolation may be conducted, for example, by a method commonly used, such as precipitation or distillation.

4. Method for Producing Semiconductor Device

The block copolymer layer phase-separated by the above-mentioned method may be further subjected to the step of etching the layer. Usually, before etching, part of the phase-separated block copolymer is removed. The etching may be conducted by a known means. This method may be used for producing a semiconductor substrate.

Thus, the method for producing a semiconductor device of the present invention comprises the steps of: (1) forming an underlayer film on a substrate using the underlayer film-forming composition of the present invention; (2) forming a block copolymer layer on the underlayer film; (3) causing the block copolymer layer formed on the underlayer film to suffer phase separation; (4) subjecting the phase-separated block copolymer layer to etching; and (5) subjecting the substrate to etching.

In the etching, for example, a gas of tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane may be used. A halogen gas is preferably used, and a fluorine-based gas is more preferably used. Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

By using the pattern of the phase-separated block copolymer layer formed using the upper-layer film-forming composition in the present invention, a desired form can be imparted to a substrate to be processed by etching, to produce an advantageous semiconductor device.

EXAMPLES

Hereinbelow, the present invention will be described in more detail with reference to the following Examples and Comparative Examples, which should not be construed as limiting the scope of the present invention.

The weight average molecular weight (Mw) of polymer (A) shown in Synthesis Examples below is the result of measurement by a gel permeation chromatography (GPC) method. In the measurement, a GPC apparatus, manufactured by Tosoh Corp., is used, and the conditions for the measurement are as follows.

Measuring apparatus: HLC-8020GPC [trade name] (manufactured by Tosoh Corp.)
GPC Columns: TSKgel G2000HXL: two columns;
G3000HXL: one column;
G4000HXL: one column [trade name] (all manufactured by Tosoh Corp.)
Column temperature: 40° C.
Solvent: Tetrahydrofuran (THF)
Flow rate: 1.0 ml/minute
Standard sample: Polystyrene (manufactured by Tosoh Corp.)

[Synthesis Example 1] Synthesis of Polymer 1

3.20 g of 4-tert-butylstyrene, 1.68 g of 2-vinylnaphthalene, 0.79 g of 2-hydroxypropyl methacrylate, and 0.34 g of 2,2'-azobisisobutyronitrile were dissolved in 24.0 g of propylene glycol monomethyl ether acetate, and then the resultant solution was heated and stirred at 100° C. for about 10 hours. The resultant reaction mixture was added dropwise to methanol, and the precipitate was collected by suction filtration, and then subjected to vacuum drying at 60° C. to recover polymer 1. The polymer had a weight average molecular weight Mw of 13,200, as determined by GPC using a molecular weight conversion calibration curve obtained from the polystyrene.

[Synthesis Example 2] Synthesis of Polymer 2

3.20 g of 4-tert-butylstyrene, 1.68 g of 2-vinylnaphthalene, 0.79 g of 2-hydroxyethyl methacrylate, and 0.34 g of 2,2'-azobisisobutyronitrile were dissolved in 24.0 g of propylene glycol monomethyl ether acetate, and then the resultant solution was heated and stirred at 100° C. for about 10 hours. The resultant reaction mixture was added dropwise to methanol, and the precipitate was collected by suction filtration, and then subjected to vacuum drying at 60° C. to recover polymer 2. The polymer had a weight average molecular weight Mw of 8,900, as determined by GPC using a molecular weight conversion calibration curve obtained from the polystyrene.

[Synthesis Example 3] Synthesis of Polymer 3

3.10 g of 4-tert-butylstyrene, 1.67 g of 2-vinylnaphthalene, 0.94 g of N-(4-hydroxyphenyl)methacrylamide, and 0.34 g of 2,2'-azobisisobutyronitrile were dissolved in 24.0 g of propylene glycol monomethyl ether acetate, and then the resultant solution was heated and stirred at 100° C. for about 10 hours. The resultant reaction mixture was added dropwise to methanol, and the precipitate was collected by suction filtration, and then subjected to vacuum drying at 60° C. to recover polymer 3. The polymer had a weight average molecular weight Mw of 7,300, as determined by GPC using a molecular weight conversion calibration curve obtained from the polystyrene.

[Synthesis Example 4] Synthesis of Polymer 4

3.58 g of 4-tert-butylstyrene, 1.43 g of 2-vinylnaphthalene, 0.65 g of 2-hydroethyl acrylate, and 0.34 g of 2,2'-azobisisobutyronitrile were dissolved in 24.0 g of propylene glycol monomethyl ether acetate, and then the resultant solution was heated and stirred at 100° C. for about 10 hours. The resultant reaction mixture was added dropwise to methanol, and the precipitate was collected by suction filtration, and then subjected to vacuum drying at 60° C. to recover polymer 4. The polymer had a weight average molecular weight Mw of 7,300, as determined by GPC using a molecular weight conversion calibration curve obtained from the polystyrene.

[Synthesis Example 5] Synthesis of Polymer 5

1.63 g of 4-tert-butylstyrene, 3.29 g of benzyl methacrylate, 0.74 g of 2-hydroxypropyl methacrylate, and 0.34 g of 2,2'-azobisisobutyronitrile were dissolved in 24.0 g of propylene glycol monomethyl ether acetate, and then the resultant solution was heated and stirred at 100° C. for about 10 hours. The resultant reaction mixture was added dropwise to methanol, and the precipitate was collected by suction filtration, and then subjected to vacuum drying at 60° C. to recover polymer 5. The polymer had a weight average molecular weight Mw of 6,400, as determined by GPC using a molecular weight conversion calibration curve obtained from the polystyrene.

Example 1

(Preparation of Underlayer Film Composition)

0.45 g of the resin obtained in Synthesis Example 1, 0.14 g of 1,3,4,6-tetrakis(methoxymethyl)glycoluril, and 0.01 g of pyridinium p-toluenesulfonate were dissolved in a mixed solvent of 139.58 g of propylene glycol monomethyl ether acetate and 59.82 g of propylene glycol monomethyl ether to obtain a 0.30% by mass solution. Then, the obtained solution was filtered using a polyethylene microfilter having a pore diameter of 0.2 μm, to prepare a solution, which is an underlayer film-forming composition for a self-organized film.

(Preparation of Block Copolymer 1)

0.5 g of a poly(4-methoxystyrene)/poly(4-trimethylsilylstyrene) copolymer (weight average molecular weight Mw: 30,200; polydisperse degree: 1.12; volume ratio: 50:50), which is a block copolymer, was dissolved in 24.5 g of propylene glycol monomethyl ether acetate to obtain a 2% by mass solution. Then, the obtained solution was filtered using a polyethylene microfilter having a pore diameter of 0.02 μm, to prepare a solution, which is a self-organized film-forming composition comprising the block copolymer.

(Preparation of Block Copolymer 2)

0.5 g of a polystyrene/poly(4-trimethylsilylstyrene) copolymer (weight average molecular weight Mw: 30,200; polydisperse degree: 1.12; volume ratio: 50:50), which is a block copolymer, was dissolved in 24.5 g of propylene glycol monomethyl ether acetate to obtain a 2% by mass solution. Then, the obtained solution was filtered using a polyethylene microfilter having a pore diameter of 0.02 μm, to prepare a solution, which is a self-organized film-forming composition comprising the block copolymer.

(Preparation of Upper-Layer Film-Forming Composition)

0.25 g of a terpolymer of N-cyclohexylmaleimide, 4-tert-butylstyrene, and tert-butyl methacrylate (molar ratio: 50:30:20) was dissolved in 9.75 g of diisoamyl ether to obtain a 2.5% by mass solution. Then, the obtained solution was filtered using a polyethylene microfilter having a pore diameter of 0.2 μm, to prepare a solution, which is an upper-layer film-forming composition for a self-organized film.

(Evaluation of Solvent Resistance of the Underlayer Film-Forming Composition)

The above-obtained underlayer film-forming composition was applied onto a silicon wafer, and heated on a hotplate at 240° C. for one minute to obtain an underlayer film (A layer). The resultant wafer having the film formed thereon was immersed in a mixed solvent of propylene glycol monomethyl ether acetate and propylene glycol monomethyl ether in a 30:70 ratio for one minute, then dried by spin drying, and the change in thickness of the film was checked. The change in thickness of the film was checked by making a calculation using the equation: (Residual film ratio)= (Thickness of the film after immersion in the solvent)/ (Thickness of the film after application). When the result of the calculation was 0.95 to 1.0, the film was judged to have a solvent resistance.

(Evaluation of Self-Organization of the Block Copolymer)

The above-obtained underlayer film-forming composition was applied onto a silicon wafer, and heated on a hotplate at 240° C. for one minute to obtain an underlayer film (A layer). The self-organized film-forming composition containing block copolymer 1 was applied onto the underlayer film by a spin coater, and heated on a hotplate at 100° C. for one minute to form a self-organized film (B layer) having a thickness of 40 nm. The upper-layer film-forming composition for a self-organized film was applied onto the self-organized film by a spinner, and then heated on a hotplate at 210° C. for 5 minutes to induce a microphase-separated structure in the block copolymer. FIG. 1 shows the arrangement of the layers.

(Observation of Microphase-Separated Structure)

Figure 2:
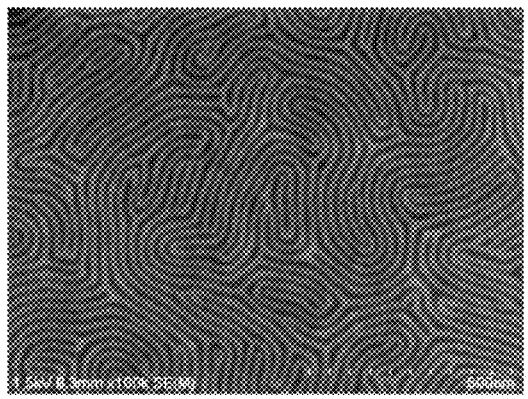
FIG. 2 A scanning electron photomicrograph of a vertically lamellar-oriented block copolymer layer formed from the underlayer film-forming composition of the present invention (Example 1).

The silicon wafer having the microphase-separated structure induced was subjected to etching using an etching machine (Lam 2300 Versys Kiyo45), manufactured by Lam Research Corporation, and using $O_2$ gas as an etching gas for 30 seconds so that the upper layer film was removed and the polymethoxystyrene region was preferentially etched. Subsequently, the resultant topography was observed by an electron microscope (S-4800) (FIG. 2).

Examples 2 to 5

Preparation of a sample and formation of a microphase-separated structure of block copolymer were conducted by repeating substantially the same procedures as in Example 1 except that polymer 1 was replaced with each of polymers 2 to 5.

Example 6

Preparation of a sample and formation of a microphase-separated structure of block copolymer were conducted by repeating substantially the same procedures as in Example 1 except that block copolymer 1 was replaced with block copolymer 2.

Comparative Example 1

(Preparation of Underlayer Film Composition)

0.45 g of a copolymer of 2-vinylnaphthalene and 2-hydroxyethyl methacrylate (85:15% by mole), which is a resin applied to the underlayer film-forming composition of PS-b-PMMA, 0.14 g of 1,3,4,6-tetrakis(methoxymethyl)glycoluril, and 0.01 g of pyridinium p-toluenesulfonate were dissolved in a mixed solvent of 139.58 g of propylene glycol monomethyl ether acetate and 59.82 g of propylene glycol monomethyl ether to prepare a 0.30% by mass solution.

Comparative Example 2

(Preparation of Underlayer Film Composition)

A solution was prepared by repeating substantially the same procedures as in Comparative Example 1 except that the copolymer used in Comparative Example 1 was replaced with a terpolymer of 2-vinylnaphthalene, benzyl methacrylate, and 2-hydroxyethyl methacrylate (55:30:15% by mole).

(Checking the Solvent Resistance and Block Copolymer Orientation)

Figure 3:
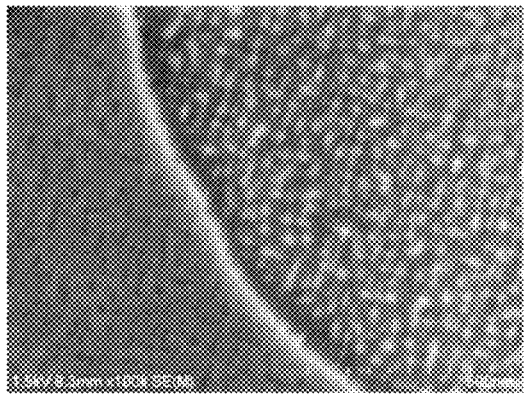
FIG. 3 A scanning electron photomicrograph of a horizontally lamellar-oriented block copolymer layer formed from the underlayer film-forming composition (Comparative Example 1).

The crosslinking property of the underlayer films prepared above in Examples 1 to 5 and Comparative Example 1, and the orientation of the block copolymers were checked. The results are shown in Table 1, FIG. 2 (vertical lamellar orientation), and FIG. 3 (horizontal lamellar orientation).

TABLE 1

| | Solvent resistance (Residual film ratio) | Block copolymer orientation |
|---|---|---|
| Example 1 | Having resistance (0.99) | Vertical lamellar orientation |
| Example 2 | Having resistance (0.99) | Vertical lamellar orientation |
| Example 3 | Having resistance (0.99) | Vertical lamellar orientation |
| Example 4 | Having resistance (0.99) | Vertical lamellar orientation |
| Example 5 | Having resistance (0.99) | Vertical lamellar orientation |
| Comparative Example 1 | Having resistance (0.99) | Horizontal lamellar orientation |
| Comparative Example 2 | Having resistance (0.99) | Horizontal lamellar orientation |

As can be seen from Table 1, the underlayer film formed using the underlayer film-forming composition of the present invention exhibits excellent solvent resistance as well as allows a microphase-separated structure of the silicon-containing block copolymer containing poly(4-methoxystyrene), poly(4-trimethylsilylstyrene) or the like, to become perpendicular to the substrate.

INDUSTRIAL APPLICABILITY

By the present invention, there can be provided an underlayer film-forming composition which exhibits excellent solvent resistance, and which allows a microphase-separated structure of a layer comprising a block copolymer formed on a substrate to become perpendicular to the substrate, and the composition can be used in the production of a semiconductor device.

The invention claimed is:

1. An underlayer film-forming composition for use in causing a layer comprising a block copolymer formed on a substrate to suffer phase separation,
   wherein the composition comprises a copolymer having:
   (A) a unit structure resulting from polymerizing a styrene compound containing a tert-butyl group,
   (B) a unit structure resulting from polymerizing an aromatic group-containing vinyl compound containing no hydroxy group, which differs from unit structure (A),
   (C) a unit structure resulting from polymerizing a compound containing (a)an (meth)acryloyl group and containing no hydroxy group, and
   (D) a unit structure resulting from polymerizing a crosslink-forming group-containing compound, wherein the crosslink-forming group is a hydroxy group, an epoxy group, a protected hydroxy group, or a protected carboxyl group,
   wherein the copolymer has a copolymerization ratio of:
   (A) 25 to 90% by mole, (B) more than 0 to 65% by mole, (C) 0 to 65% by mole, and (D) 10 to 20% by mole,
   wherein the copolymer in the composition has a proportion of an amount of unit structures containing an aromatic group based on a total amount of unit structures (A), (B), and (C) of 81 to 90% by mole, and
   wherein the unit structure (B) is represented by formula (4-1) or (4-2):

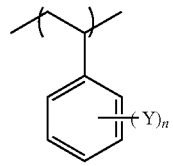

Formula (4-1)

wherein in formula (4-1), each of n quantity of Y independently represents an alkyl group, an alkoxy group, a cyano group, an amide group, an alkoxycarbonyl group, or a thioalkyl group, and n represents an integer of 1 to 5;

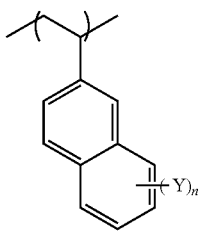

Formula (4-2)

wherein in formula (4-2), each of n quantity of Y independently represents a halogen atom, an alkyl group, an alkoxy group, a cyano group, an amide group, an alkoxycarbonyl group, or a thioalkyl group, and n represents an integer of 0 to 7.

2. The composition according to claim 1, wherein the block copolymer formed on the substrate is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure resulting from polymerizing a lactide are bound.

3. The composition according to claim 1, wherein the unit structure (A) is represented by formula (1):

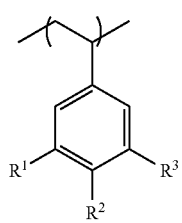

Formula (1)

wherein one or two of $R^1$ to $R^3$ are a tert-butyl group.

4. The composition according to claim 1, wherein the unit structure (D) is represented by formula (2-1), (2-2), (3-1), or (3-2):

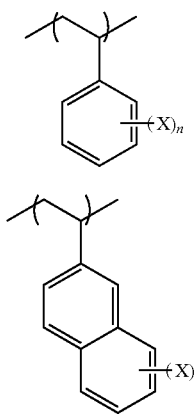

Formula (2-1)

Formula (2-2)

wherein, in formulae (2-1) and (2-2), each of n quantity of X independently represents a hydroxy group, a halogen atom, an alkyl group, an alkoxy group, a cyano group, an amide group, an alkoxycarbonyl group, or a thioalkyl group, and n represents an integer of 1 to 7,

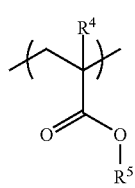

Formula (3-1)

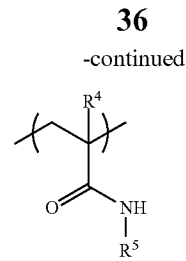

Formula (3-2)

wherein, in formulae (3-1) and (3-2), $R^4$ represents a hydrogen atom or a methyl group, and $R^5$ represents a hydroxyphenyl group or a linear, branched, or cyclic alkyl group having 1 to 10 carbon atoms, which contains a hydroxy group and is optionally substituted with a halogen atom.

5. The composition according to claim 1, wherein the unit structure (C) is represented by formula (5-1) or (5-2):

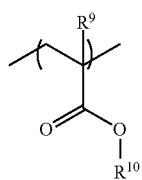

Formula (5-1)

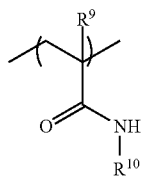

Formula (5-2)

wherein, in formulae (5-1) and (5-2), $R^9$ represents a hydrogen atom or a methyl group, and $R^{10}$ independently represents a hydrogen atom, an alkoxy group having 1 to 5 carbon atoms, a benzyl group, an anthrylmethyl group, or a linear, branched, or cyclic alkyl group having 1 to 10 carbon atoms, which is optionally substituted with a halogen atom.

6. The composition according to claim 1, wherein the unit structure (B) is a unit structure including vinylnaphthalene.

7. A method for producing a phase-separated pattern of a block copolymer, comprising the steps of:
   (1) forming an underlayer film on a substrate using the composition according to claim 1;
   (2) forming a block copolymer layer on the underlayer film; and
   (3) causing the block copolymer layer formed on the underlayer film to suffer phase separation.

8. The method according to claim 7, further comprising the step of forming an upper layer film on the block copolymer layer between step (2) and step (3).

9. The method according to claim 7 wherein a block copolymer in the block copolymer layer is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure resulting from polymerizing a lactide are bound.

10. A method for producing a semiconductor device, comprising the steps of:
   (1) forming an underlayer film on a substrate using the composition according to claim 1;
   (2) forming a block copolymer layer on the underlayer film;
   (3) causing the block copolymer layer formed on the underlayer film to suffer phase separation;
   (4) subjecting the phase-separated block copolymer layer to etching; and
   (5) subjecting the substrate to etching.

11. The method according to claim 10, wherein a block copolymer in the block copolymer layer is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure resulting from polymerizing a lactide are bound.

12. An underlayer film for use in causing a layer comprising a block copolymer formed on a substrate to suffer phase separation, wherein the underlayer film comprises a copolymer having:
   (A) a unit structure resulting from polymerizing a styrene compound containing a tert-butyl group,
   (B) a unit structure resulting from polymerizing an aromatic group-containing vinyl compound containing no hydroxy group, which differs from unit structure (A),
   (C) a unit structure resulting from polymerizing a compound containing (a)an (meth)acryloyl group and containing no hydroxy group, and
   (D) a unit structure resulting from polymerizing a crosslink-forming group-containing compound, wherein the crosslink-forming group is a hydroxy group, an epoxy group, a protected hydroxy group, or a protected carboxyl group,
   wherein the copolymer has a copolymerization ratio of: (A) 25 to 90% by mole, (B) more than 0 to 65% by mole, (C) 0 to 65% by mole, and (D) 10 to 20% by mole,
   wherein the copolymer has a proportion of an amount of unit structures containing an aromatic group based on a total amount of unit structures (A), (B), and (C) of 81 to 90% by mole, and
   wherein the unit structure (B) is represented by formula (4-1) or (4-2):

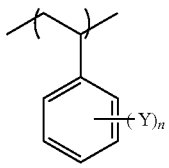

Formula (4-1)

wherein in formula (4-1), each of n quantity of Y independently represents an alkyl group, an alkoxy group, a cyano group, an amide group, an alkoxycarbonyl group, or a thioalkyl group, and n represents an integer of 1 to 5;

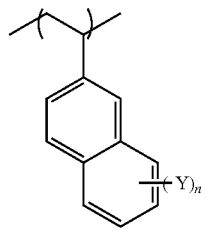

Formula (4-2)

wherein in formula (4-2), each of n quantity of Y independently represents a halogen atom, an alkyl group, an alkoxy group, a cyano group, an amide group, an alkoxycarbonyl group, or a thioalkyl group, and n represents an integer of 0 to 7.

13. The underlayer film according to claim 12, wherein the block copolymer formed on the substrate is a block copolymer in which a silicon-containing polymer containing a structural unit from styrene substituted with a silicon-containing group, and either a silicon-non-containing polymer containing a structural unit from styrene optionally substituted with an organic group or a silicon-non-containing polymer containing a structural unit from a structure resulting from polymerizing a lactide are bound.

14. The composition according to claim 1, wherein the composition further contains a crosslinkable compound.

15. The composition according to claim 14, wherein the composition contains the crosslinkable compound in a proportion to the copolymer contained in the composition of from 5 to 50% by mass.

16. The composition according to claim 1, wherein the composition further contains a nitrogen-containing compound having 2 to 4 nitrogen atoms, and substituted with a methylol group.

* * * * *